United States Patent
Hopper et al.

(10) Patent No.: US 6,924,167 B1
(45) Date of Patent: Aug. 2, 2005

(54) METHOD OF FORMING A BANDGAP TUNED VERTICAL COLOR IMAGER CELL

(75) Inventors: Peter J. Hopper, San Jose, CA (US); Philipp Lindorfer, San Jose, CA (US)

(73) Assignee: Foveon, Inc., Santa Clara, CA (US)

( * ) Notice: Subject to any disclaimer, the term of this patent is extended or adjusted under 35 U.S.C. 154(b) by 0 days.

(21) Appl. No.: 10/438,482

(22) Filed: May 15, 2003

Related U.S. Application Data

(62) Division of application No. 10/219,836, filed on Aug. 15, 2002, now Pat. No. 6,646,318.

(51) Int. Cl.$^7$ .............................................. H01L 21/00
(52) U.S. Cl. ......................................... 438/57; 438/74
(58) Field of Search ........................... 438/48–98, 479, 438/483, 440, 188, 189, 414, 616

(56) References Cited

U.S. PATENT DOCUMENTS

| | | | | |
|---|---|---|---|---|
| 5,282,993 A | * | 2/1994 | Karg ................... 252/62.3 BT |
| 5,329,136 A | * | 7/1994 | Goossen ...................... 257/17 |
| 5,562,781 A | | 10/1996 | Ingram et al. .............. 136/249 |
| 5,646,421 A | * | 7/1997 | Liu .............................. 257/21 |
| 5,923,049 A | * | 7/1999 | Bohm et al. ................... 257/55 |
| 5,932,873 A | | 8/1999 | Bergemont et al. ...... 250/208.1 |
| 5,962,844 A | | 10/1999 | Merrill et al. ........... 250/214 A |
| 5,965,875 A | | 10/1999 | Merrill ....................... 250/226 |
| 5,970,316 A | | 10/1999 | Merrill ........................ 438/57 |
| 5,982,012 A | | 11/1999 | Merrill ....................... 257/463 |
| 6,002,432 A | | 12/1999 | Merrill et al. .............. 348/241 |
| 6,018,365 A | | 1/2000 | Merrill ....................... 348/302 |
| 6,066,510 A | | 5/2000 | Merrill ........................ 438/57 |
| 6,088,058 A | | 7/2000 | Mead et al. ................ 348/296 |
| 6,150,683 A | | 11/2000 | Merrill et al. .............. 257/292 |
| 6,160,282 A | | 12/2000 | Merrill ....................... 257/292 |
| 6,211,510 B1 | | 4/2001 | Merrill et al. ........... 250/208.1 |
| 6,246,043 B1 | | 6/2001 | Merrill ..................... 250/208.1 |
| 6,281,561 B1 | | 8/2001 | Stiebig et al. .............. 257/440 |
| 6,310,382 B1 | | 10/2001 | Stiebig et al. .............. 257/440 |
| 6,340,788 B1 | * | 1/2002 | King et al. ................. 136/261 |
| 6,342,405 B1 | * | 1/2002 | Major et al. .................. 438/46 |
| 6,342,720 B1 | * | 1/2002 | Presting et al. ............. 257/440 |
| 6,369,853 B1 | | 4/2002 | Merrill et al. .............. 348/302 |
| ,058,353 A1 | | 5/2002 | Merrill ........................ 438/57 |
| 6,410,899 B1 | | 6/2002 | Merrill et al. ........... 250/208.1 |
| 6,452,633 B1 | | 9/2002 | Merrill et al. .............. 348/302 |
| 6,476,372 B2 | | 11/2002 | Merrill et al. ........... 250/208.1 |
| 6,512,544 B1 | | 1/2003 | Merrill et al. .............. 348/302 |
| 6,525,304 B1 | | 2/2003 | Merrill et al. ........... 250/208.1 |
| 6,606,120 B1 | | 8/2003 | Merrill et al. .............. 348/273 |
| 6,632,701 B2 | | 10/2003 | Merrill ........................ 438/70 |
| 6,636,261 B1 | | 10/2003 | Pritchard et al. ........... 348/308 |
| 6,697,114 B1 | | 2/2004 | Merrill ....................... 348/308 |
| RE38,499 E | | 4/2004 | Merrill et al. .............. 348/301 |
| 6,727,521 B2 | | 4/2004 | Merrill ........................ 257/98 |
| 6,731,397 B1 | | 5/2004 | Merrill et al. ............. 358/1.16 |
| 6,741,283 B1 | | 5/2004 | Merrill et al. .............. 348/308 |
| 6,750,489 B1 | | 6/2004 | Merrill ....................... 257/292 |
| 6,760,070 B1 | | 7/2004 | Merrill et al. .............. 348/294 |
| 2002/0068393 A1 | * | 6/2002 | Fitzgerald et al. .......... 438/172 |
| 2003/0042500 A1 | * | 3/2003 | Rhodes ....................... 257/185 |
| 2003/0049894 A1 | * | 3/2003 | Berger et al. .............. 438/183 |
| 2004/0007715 A1 | * | 1/2004 | Webb et al. ................ 257/192 |

FOREIGN PATENT DOCUMENTS

DE              19714054     * 10/1998

* cited by examiner

*Primary Examiner*—Savitri Mulpuri
(74) *Attorney, Agent, or Firm*—Sierra Patent Group, Ltd

(57) ABSTRACT

A combination of materials is used to form the photodiodes of a vertical color imager cell. The materials used to form the photodiodes have different band gaps that allow the photon absorption rates of the photodiodes to be adjusted. By adjusting the photon absorption rates, the sensitivities of the photodiodes and thereby the characteristics of the imager can be adjusted.

6 Claims, 3 Drawing Sheets

METHOD OF FORMING A BANDGAP TUNED VERTICAL COLOR IMAGER CELL

This is a divisional application of application Ser. No. 10/219,836 filed on Aug. 15, 2002, now U.S. Pat. No. 6,646,318.

BACKGROUND OF THE INVENTION

1. Field of the Invention

The present invention relates to imager cells and, more particularly, to a bandgap tuned vertical color imager cell.

2. Description of the Related Art

A standard imager cell is a device that utilizes a photodiode to convert light energy into photo-generated electrons, and a number of transistors to control the operation of the photodiode and sense the number of photo-generated electrons that were produced by the light energy.

A color imager cell is a cell that produces photo information for more than one color, typically red, green, and blue. Digital cameras utilize millions of color imager cells that capture images based on the amount of reflected red, green, and blue light energy that strikes each imager cell.

One approach to implementing a color imager cell is to utilize three standard imager cells, and vary the depth of the sense point. Blue photons are high-energy photons that are absorbed at the surface of the photodiode, while green photons have less energy and are absorbed at a first depth that lies below the surface of the photodiode. Red photons have even less energy and are absorbed at a second depth that lies below the first depth.

Thus, by sensing the number of photo-generated electrons at the surface of a first cell, at the first depth in a second cell, and at the second depth in a third cell, blue, green, and red photo information, respectively, can be obtained from the three standared imager cells. One drawback of this approach, however, is that a color imager cell is three times the size of a standard imager cell.

Another approach to implementing a color imager cell that addresses the size problems of the three-cell approach is a vertical color imager cell. A vertical color imager cell is an imager cell that collects photo-generated electrons that represent different colors, such as red, green, and blue, at different depths in the same photodiode.

In an imager cell, the transistors required to operate the photodiode and sense the number of photo-generated electrons utilize a relatively small amount of space with respect to the amount of space utilized by the photodiode. Thus, one of the advantages of a vertical color imager cell is that since the cell collects multiple colors with the same photodiode, a vertical color imager cell is only slightly larger than a standard imager cell.

U.S. patent application Publication U.S. 2002/0058353 A1 published on May 16, 2002 describes a vertical color imager cell. FIG. 1 shows a combined cross-sectional and schematic diagram that illustrates a prior art color imager cell 100. Cell 100 is substantially the same as the cell shown in FIG. 2A of the '353 published application.

As shown in FIG. 1, imager cell 100 Includes a first p− region 110, a first n+ region 112 that contacts p− region 110, and a first depletion region 114 that is formed at the junction between regions 110 and 112. Imager cell 100 also includes a second p− region 120 that contacts n+ region 112, a second n+ region 122 that contacts p− region 120, and a second depletion region 124 that is formed at the junction between regions 120 and 122. In addition, imager cell 100 further includes a third p-type region 130 that contacts n+ region 122, a third n+ region 132 that contacts p− region 130, and a third depletion region 134 that is formed at the junction between regions 130 and 132.

In operation, as shown in FIG. 1, p− regions 110, 120, and 130 are connected to ground. In addition, n+ regions 112, 122, and 132 are connected to first, second, and third reset transistors 150, 152, and 154, respectively. Prior to collecting photo information, reset transistors 150, 152, and 154 are pulsed on which, in turn, places a positive potential on n+ regions 112, 122, and 132.

The positive potential reverse biases the pn junction of regions 110 and 112, thereby forming a red collecting photodiode, and the pn junction of regions 120 and 122, thereby forming a green collecting photodiode. The positive potential also reverse biases the pn junction of regions 130 and 132, thereby forming a blue collecting photodiode.

Once the positive potentials have been placed on n+ regions 112, 122, and 132, light energy, in the form of photons, is collected by the red, green, and blue photodiodes. The red photons are absorbed by the red photodiode which, in turn, forms a number of red electron-hole pairs, while the green photons are absorbed by the green photodiode which, in turn, forms a number of green electron-hole pairs. Similarly, the blue photons are absorbed by the blue photodiode which, in turn, forms a number of blue electron-hole pairs.

The red electrons from the electron-hole pairs that are formed in depletion region 114 move under the influence of the electric field towards n+ region 112, where each additional electron collected by n+ region 112 reduces the positive potential that was placed on n+ region 112 by reset transistor 150. On the other hand, the holes formed in depletion region 114 move under the influence of the electric field towards p− region 110.

In addition, the electrons, which are from the electron-hole pairs that are formed in p− region 110 within a diffusion length of depletion region 114, diffuse to depletion region 114 and are swept to n+ region 112 under the influence of the electric field. Further, the electrons that are formed in n+ region 112 remain in n+ region 112.

Similarly, the green electrons from the electron-hole pairs that are formed in depletion region 124 move under the influence of the electric field towards n+ region 122, where each additional electron collected by n+ region 122 reduces the positive potential that was placed on n+ region 122 by reset transistor 152. On the other hand, the holes formed in depletion region 124 move under the influence of the electric field towards p− region 120.

In addition, the electrons, which are from the electron-hole pairs that are formed in p− region 120 within a diffusion length of depletion region 124, diffuse to depletion region 124 and are swept to n+ region 122 under the influence of the electric field. Further, the electrons that are formed in n+ region 122 remain in n+ region 122.

As with the red and green electrons, the blue electrons from the electron-hole pairs that are formed in depletion region 134 move under the influence of the electric field towards n+ region 132, where each additional electron collected by n+ region 132 reduces the positive potential that was placed on n+ region 132 by reset transistor 154. On the other hand, the holes formed in depletion region 134 move under the influence of the electric field towards p− region 130.

In addition, the electrons, which are from the electron-hole pairs that are formed in p− region 130 within a diffusion length of depletion region 134, diffuse to depletion region 134 and are swept to n+ region 132 under the influence of the electric field. Further, the electrons that are formed in n+ region 132 remain in n+ region 132.

After the red, green, and blue photodiodes have collected light energy for a period of time, known as the integration period, sense circuitry associated with the photodiodes detects the change in potential on n+ regions 112, 122, and 132. Specifically, in addition to a reset transistor, each photodiode also has an associated source follower transistor SF and a row select transistor RS.

The change in potentials on an n+ region is present on the gate of the associated source follower transistor SF, while the source of the source follower transistor SF is one diode drop below the potential. Thus, when the gate of the row select transistor RS is pulsed, an output potential equal to the photodiode potential less a diode drop is output to a sense cell to determine the output potential. Once the change in positive potential has been determined, the photodiodes are reset and the process is repeated.

One problem with imager cell 100 is that the red, green, and blue photodiodes of cell 100 do not produce an equal number of photo-generated electrons when exposed to a white light source. The blue photodiode produces the largest number, with the green photodiode next and the red photodiode producing the smallest number of photo-generated electrons. The difference in the numbers of electrons must then be compensated for to produce an equal response.

SUMMARY OF THE INVENTION

The present invention provides a vertical imager cell that utilizes a combination of materials to adjust the band gaps and, in turn, adjust the photon absorption rate of the color photodiodes used in an imager cell. By adjusting the photon absorption rate, the numbers of electrons collected by the photodiodes, and thereby the characteristics of the imager, can be adjusted.

An imager cell in accordance with the present invention includes a first layer of material, and a second layer of material that is formed on the first layer of material. In addition, the imager cell also includes a third layer of material that is formed on the second layer of material, and a fourth layer of material that is formed on the third layer of material. Further, a top layer of material is formed over the fourth layer of material. The top layer of material is different from the fourth layer of material.

The imager cell additionally includes a first region of a first conductivity type that is formed in the first layer of material and a lower portion of the second layer of material. The imager cell further includes a first region of a second conductivity type that is formed in an upper portion of the second layer of material to contact the first region of the first conductivity type. In addition, a first depletion region is formed between the first regions of the first and second conductivity types.

Further, the imager cell includes a second region of the first conductivity type that is formed in the third layer of material and the lower portion of fourth layer of material to contact the first region of the second conductivity type. In addition, the imager cell includes a second region of the second conductivity type that is formed in an upper portion of the fourth layer of material to contact the second region of the first conductivity type. Further, a second depletion region is formed between the second regions of the first and second conductivity types.

The imager cell also includes a third region of the first conductivity type that is formed in the top layer of material.

In addition, the imager cell includes a third region of the second conductivity type that is formed in a surface of the top layer of material to contact the third region of the first conductivity type. Further, a third depletion region is formed between the third regions of the first and second conductivity types.

The present invention also includes a method of forming an imager cell that includes the steps of forming a first layer of material, and forming a second layer of material, which has a first conductivity type, on the first layer of material. The method also includes the steps of doping a top portion of the second layer of material to have a second conductivity type, and forming a third layer of material on the second layer of material.

The method additionally includes the steps of forming a fourth layer of material of the first conductivity type on the third layer of material, and doping a top portion of the fourth layer of material to have the second conductivity type. Further, the method includes the steps of forming a top layer of material of the first conductivity type over the fourth layer of material, and doping a top portion of the top layer of material to have the second conductivity type.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 3A–3D are a series of cross-sectional views illustrating an example of a method of forming the photodiode structure of FIG. 2 in accordance with the present invention.

DETAILED DESCRIPTION OF THE INVENTION

Figure 1:
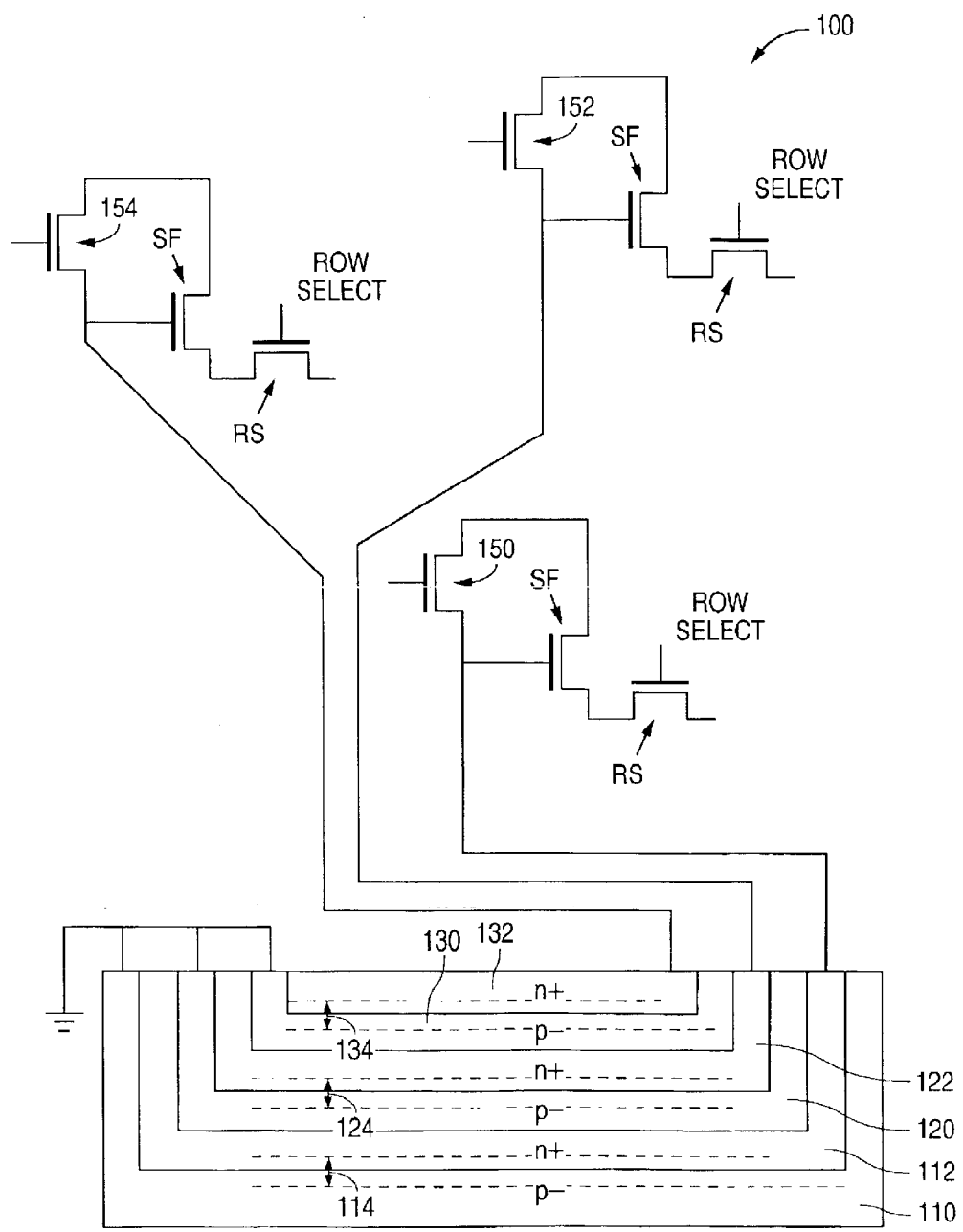
FIG. 1 is a combined cross-sectional and schematic diagram illustrating a prior art vertical color imager cell 100.
Figure 2:
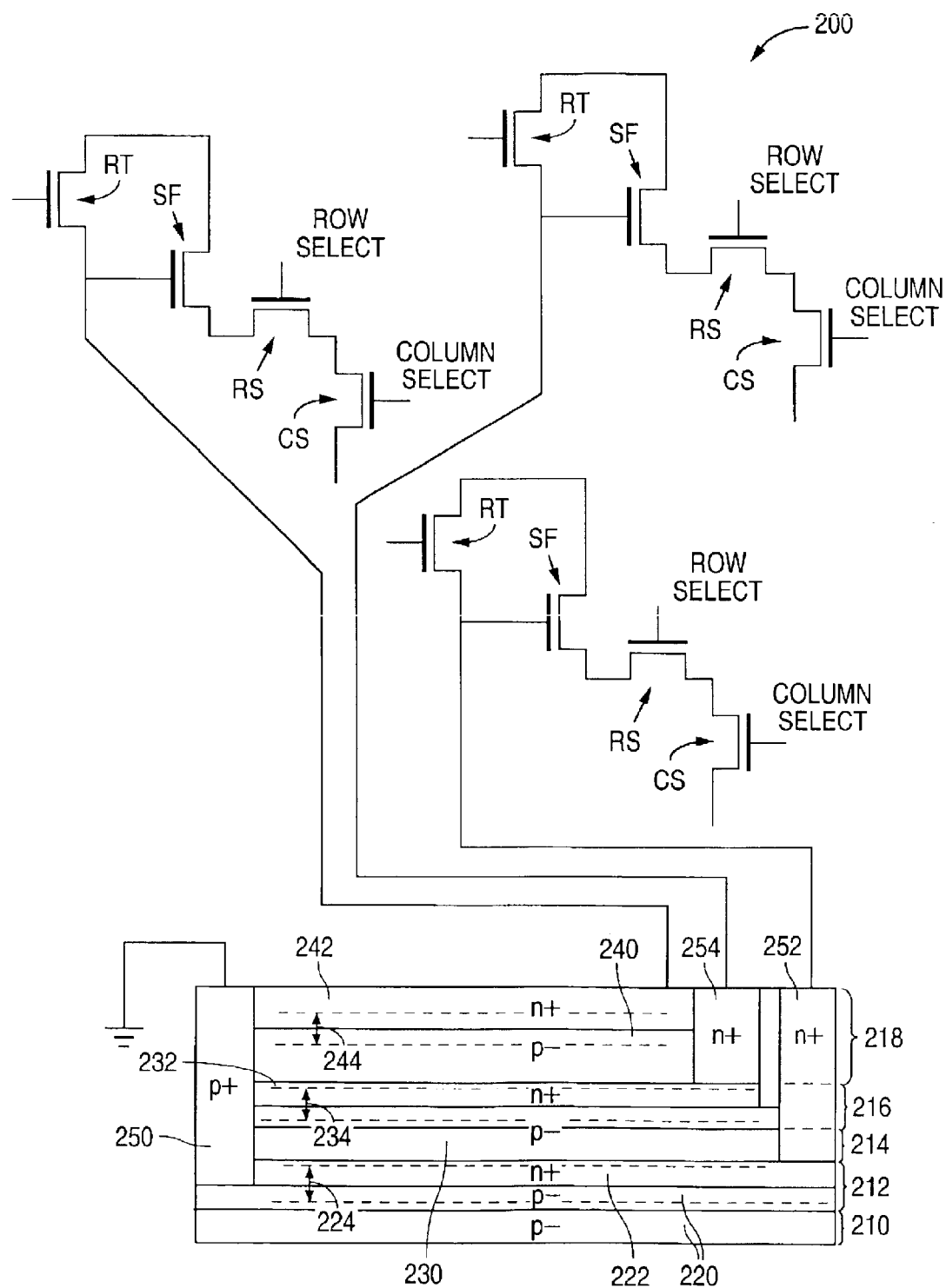
FIG. 2 is a combined cross-sectional and schematic diagram illustrating an example of a vertical color imager cell 200 in accordance with the present invention.

FIG. 2 shows a combined cross-sectional and schematic diagram that illustrates an example of a vertical color imager cell 200 in accordance with the present invention. As described in greater detail below, cell 200 utilizes a combination of materials to vary the photon absorption rate of the imager.

As shown in FIG. 2, cell 200 includes a first layer of material 210, and a second layer of material 212 that is formed on the first layer of material 210. In addition, cell 200 includes a third layer of material 214 that is formed on the second layer of material 212, and a fourth layer of material 216 that is formed on the third layer of material 214. Further, cell 200 includes a fifth layer of material 218 that is formed on the fourth layer of material 216.

In addition to the five layers of material 210, 212, 214, 216, and 218, cell 200 also includes three p– regions and three n+ regions that form three vertical photodiodes. As further shown in FIG. 2, imager cell 200 includes a first p– region 220 that is formed in layer 210 and the lower portion of layer 212, and a first n+ region 222 that is formed in the upper portion of layer 212 to contact p– region 220. In addition, cell 200 has a first depletion region 224 that is formed between regions 220 and 222.

Imager cell 200 additionally includes a second p– region 230 that is formed in layer 214 and the lower portion of layer 216 to contact n+ region 222. Cell 200 further includes a second n+ region 232 that is formed in the upper portion of layer 216 to contact p– region 230, and a second depletion region 234 that is formed between regions 230 and 232.

Imager cell 200 further includes a third p– region 240 that is formed in layer 218 to contact n+ region 232, and a third n+ region 242 that is formed in the surface of layer 218 to contact p– region 240. In addition, cell 200 includes a third depletion region 244 that is formed between regions 240 and 242. Cell 200 also includes a p+ sinker 250 that is connected to p– regions 220, 230, and 240, an n+ sinker 252 that is connected to n+ region 222, and an n+ sinker 254 that is connected to n+ region 232.

As further shown in FIG. 2, imager cell 200 includes three sets of control transistors, with each set having a reset transistor RT, a source-follower transistor SF, and a select transistor RS. The select transistor from each set can be either a row or column select transistor and can, for example, share the same select line. Sharing the same select line allows the three colors to be measured at the same time. In addition, each set can optionally include a second select transistor CS (a column or row select transistor) if an individual pixel read out is desired.

In operation, as shown in FIG. 2, p– regions 220, 230, and 240 are connected to ground via p+ sinker region 250. In addition, n+ regions 222, 232, and 242 are connected to the sources of the reset transistors RT. Prior to collecting photo information, the reset transistors RT are pulsed on which, in turn, places a positive potential on n+ regions 222, 232, and 242.

The positive potential reverse biases the pn junction of regions 220 and 222, thereby forming a red collecting photodiode, and the pn junction of regions 230 and 232, thereby forming a green collecting photodiode. The positive potential also reverse biases the pn junction of regions 240 and 242, thereby forming a blue collecting photodiode.

Once the positive potentials have been placed on n+ regions 222, 232, and 242, light energy, in the form of photons, is collected by the red, green, and blue photodiodes. The red photons are absorbed by the red photodiode which, in turn, forms a number of red electron-hole pairs, while the green photons are absorbed by the green photodiode which, in turn, forms a number of green electron-hole pairs. Similarly, the blue photons are absorbed by the blue photodiode which, in turn, forms a number of blue electron-hole pairs.

The red, green, and blue electrons from the electron-hole pairs that are formed in depletion regions 224, 234, and 244, respectively, move under the influence of the electric field towards n+ regions 222, 232, and 242, respectively. In addition, each additional electron collected by n+ regions 222, 232, and 242 reduces the positive potential that was placed on n+ regions 222, 232, and 242 by the reset transistors RT. On the other hand, the holes formed in depletion regions 224, 234, and 244 move under the influence of the electric field towards p– regions 220, 230, and 240, respectively.

In addition, the electrons, which are from the electron-hole pairs that are formed in p– regions 220, 230, and 240 within a diffusion length of depletion regions 224, 234, and 244, respectively, diffuse to depletion regions 224, 234, and 244, respectively. The electrons are then swept through depletion regions 224, 234, and 244 to n+ regions 222, 234, and 244, under the influence of the electric field. Further, the electrons that are formed in n+ regions 222, 234, and 244 remain in n+ regions 222, 234, and 244, respectively.

After the red, green, and blue photodiodes have collected light energy for an integration period, the control transistors associated with the photodiodes detects the change in potential on n+ regions 222, 232, and 242. Specifically, the change in potential on an n+ region is present on the gate of the associated source follower transistor SF, while the source of the source follower transistor SF is one diode drop below the gate potential.

Thus, when the gate of the select transistor RS is pulsed, an output potential equal to the photodiode potential less a diode drop is output to a sense cell to determine the output potential. Once the change in positive potential has been determined, the photodiodes are reset and the process is repeated.

As shown in FIG. 2, cell 200 is formed so that depletion region 224 of the red photodiode and a thin adjoining layer of p– region 220 (equal to an electron diffusion length) are formed in the second layer of material 212. In accordance with the present invention, the second layer of material 212 is formed from a material that has a lower band gap than the material used to form the fifth layer of material 218.

For example, when the fifth layer of material 218 is formed from single crystal silicon, which has a band gap of 1.1 eV, the second layer of material can be formed from silicon germanium, which has a band gap of 0.7 eV. Since silicon germanium has a lower band gap than single crystal silicon, silicon germanium is more sensitive to red photons than single crystal silicon. Thus, when silicon germanium is utilized, a larger number of photo-generated electrons are formed in depletion region 224 than are formed in the depletion region of a silicon vertical color imager, such as depletion region 114 of imager 100.

Cell 200 is also formed so that depletion region 234 of the green photodiode and a thin adjoining layer of p– region 230 (equal to an electron diffusion length) are formed in the fourth layer of material 216. The fourth layer of material 216 can also formed from a material that has a lower band gap than the material used to form the fifth layer of material 218.

For example, when the fifth layer of material 218 is formed from single crystal silicon, the fourth layer of material 216 can be formed from silicon germanium. As above, since silicon germanium has a lower band gap than single crystal silicon, silicon germanium is more sensitive to green photons than single crystal silicon. Thus, when silicon germanium is utilized, a larger number of photo-generated electrons are formed in depletion region 234 than are formed in the depletion region of a silicon vertical color imager, such as depletion region 124 of imager 100.

In the present example, cell 200 is further formed so that depletion region 244 of the blue photodiode and a thin adjoining layer of p– region 240 (equal to an electron diffusion length) are both formed in the fifth layer of material 218. When the fifth layer of material 218 is formed from single crystal silicon, depletion region 244 collects about the same number of photo-generated electrons as the depletion region of a conventional vertical color imager, such as depletion region 134 of imager 100.

When the second and fourth layers of material 212 and 216 are the same, the relative concentrations of the elements of the material can be the same or different. For example, when the second and fourth layers of material 212 and 216 are silicon germanium, the concentration of germanium in layers 212 and 216 can be the same or different.

One of the advantages of the present invention is that the photon absorption characteristics of the vertical photodiodes can be tuned to a desired value. For example, when exposed to a white light source, the number of photo-generated electrons collected by a red photodiode can be increased to be approximately equal to the number of photo-generated electrons collected by a blue photodiode by using a material with a lower band gap and, therefore, a greater sensitivity.

Similarly, the number of photo-generated electrons collected by a green photodiode when exposed to white light can be increased to be approximately equal to the number of photo-generated electrons collected by a blue photodiode by using a material with a lower band gap and, therefore, a greater sensitivity.

Although the above description used single crystal silicon as an example of a material that can be used to implement the fifth layer of material 218, and silicon germanium as an example of a material that has a band gap that is less than single crystal silicon, the present invention is not limited to these materials.

Instead, the present invention includes all materials that have a lower band gap than the material used to form the fifth layer of material, and can withstand the fabrication environment. When the fifth layer of material is formed from single crystal silicon, a few examples of the materials that can be used to form the fourth layer of material include gallium nitride with different stochastics, gallium arsenide, and indium phosphide.

Figure 3D:
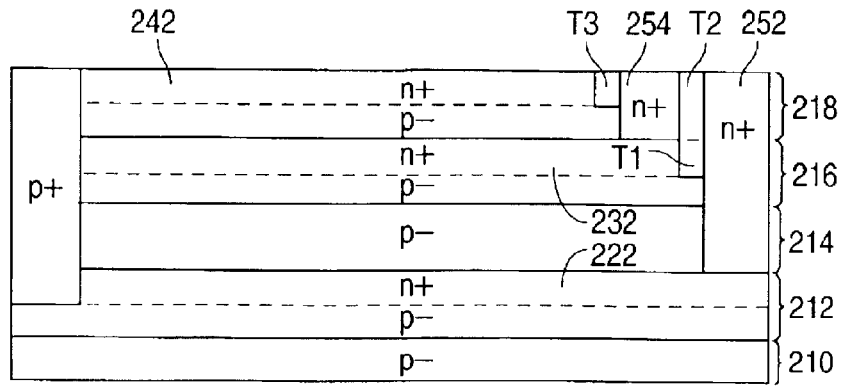

FIGS. 3A–3D show a series of cross-sectional views that illustrate an example of a method of forming the photodiode structure of FIG. 2 in accordance with the present invention. As shown in FIG. 3A, the first layer of material 210 is formed as a p– single crystal silicon layer, while the second layer of material 212 is epitaxially or otherwise formed on layer 210 as a p– silicon germanium layer.

Following the formation of silicon germanium layer 212, the surface of layer 212 is blanket implanted to form n+ region 222. In addition, the bottom portion of p+ sinker region 250 is formed through the n+ region 222 of layer 212 to contact the p– region of layer 212 using conventional masking and implanting steps. (The bottom portion of p+ sinker region 250 can alternately be formed later as part of a multi implant step that utilizes different implant energies.)

Figure 3B:
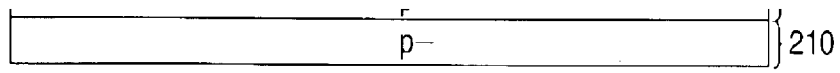

Next, as shown in FIG. 3B, the third layer of material 214 is epitaxially or otherwise formed on layer 212. Third layer 214 can be formed as a layer of p– single crystal silicon, or a layer of p– silicon germanium. Following the formation of layer 214, the next portion of p+ sinker region 250 is formed through silicon layer 214 using conventional masking and implanting steps. (The next portion of p+ sinker region 250 can alternately be formed later as part of a multi implant step that utilizes different implant energies.) Further, the lower portion of n+ sinker region 252 is formed through p– layer 214 to contact n+ region 222 using conventional masking and implanting steps.

Figure 3C:
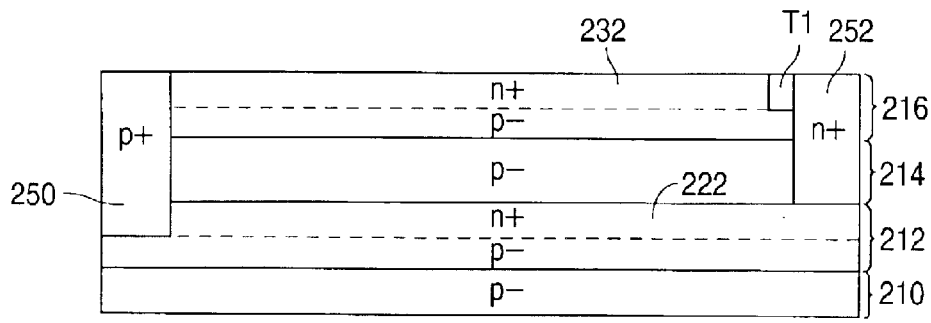
Figure 3D:
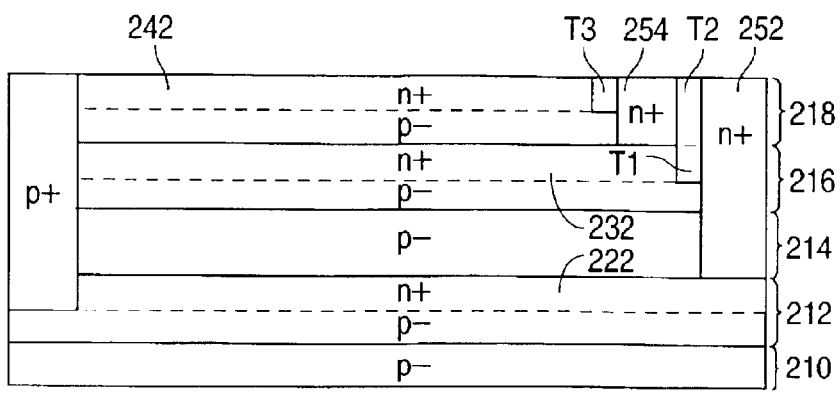

Following this, as shown in FIG. 3C, the fourth layer of material 216 is epitaxially or otherwise formed on layer 214 as a p– silicon germanium layer. (When the third layer of material 214 is formed of silicon germanium, the third layer of material 214 and the fourth layer of material 216 are formed at the same time as a single layer of material.) Following the formation of silicon germanium layer 216, the surface of layer 216 is blanket implanted to form n+ region 232.

In addition, the next portion of p+ sinker region 250 is formed through layer 216 using conventional masking and implanting steps. (The next portion of p+ sinker region 250 can alternately be formed later as part of a multi implant step that utilizes different implant energies.) Further, the next portion of n+ sinker region 252 is formed through layer 216 using conventional masking and implanting steps. (The next portion of n+ sinker region 252 can alternately be formed later as part of a multi implant step that utilizes different implant energies.) An isolation trench T1 is also formed in layer 216 to isolate n+ region 232 of layer 216 from n+ sinker region 252 using conventional trench formation techniques.

Next, as shown in FIG. 3D, the fifth layer of material 218 is epitaxially or otherwise formed on layer 216 as a layer of p– single crystal silicon. Following the formation of silicon layer 218, the surface of layer 218 is masked and Implanted using conventional steps to form n+ region 242.

In addition, the top portion of p+ sinker region 250 is formed through layer 218 using conventional masking and implanting steps. (The portions below the top portion of sinker region 250 can be formed at this point as part of a multi implant step that utilizes different implant energies.) Further, the top portion of n+ sinker region 252 is formed through layer 218 using conventional masking and implanting steps. (The portions below the top portion of sinker region 252 can alternately be formed at this point as part of a multi implant step that utilizes different implant energies.)

An isolation trench T2 is also formed through layer 218 to contact trench T1 and isolate n+ region 242 of layer 218 from n+ sinker region 252 using conventional trench formation techniques. Further, sinker region 254 is formed through layer 218 using conventional masking and implanting steps to contact n+ region 232. In addition, an isolation trench T3 is also formed through layer 218 to isolate n+ region 242 of layer 218 from n+ sinker regions 252 and 254 using conventional trench formation techniques.

It should be understood that the above descriptions are examples of the present invention, and that various alternatives of the invention described herein may be employed in practicing the invention. The present invention can be modified to include prior art elements and steps, such as those disclosed in U.S. patent application Publication U.S. 2002/0058353 A1 published on May 16, 2002 to Richard Merrill for Vertical Color Filter Detector Group and Array, which is hereby incorporated by reference. For example, a light shield can be added to cover the sinkers 250, 252, and 254 along with the control transistors.

In addition, although the present invention has been described in terms of three photodiodes, the present invention is not limited to three photodiodes, but can be extended to cover four or more vertical color photodiodes. For example, when four photodiodes are used, the second layer of material, which includes the depletion region of the bottom photodiode, has a band gap that is less than the band gap of the top layer of material, which includes the depletion region of the top photodiode.

Further, the fourth layer of material, which includes the depletion region of the second from the bottom photodiode, has a band gap that is less than the band gap of the top layer of material, which includes the depletion region of the top photodiode. Thus, it is intended that the following claims define the scope of the invention and that structures and methods within the scope of these claims and their equivalents be covered thereby.

What is claimed is:

1. A method of forming an imager cell, the method comprising the steps of:

forming a first layer of material;

forming a second layer of material on the first layer of material, the second layer of material having a first conductivity type;

doping a top portion of the second layer of material to have a second conductivity type;

forming a third layer of material on the second layer of material;

forming a fourth layer of material of the first conductivity type on the third layer of material;

doping a top portion of the fourth layer of material to have the second conductivity type;

forming a top layer of material of the first conductivity type over the fourth layer of material; and doping a top portion of the top layer of material to have the second conductivity type, wherein the top layer of material having a band gap that is larger than a band gap of at least one of the underlying layers of material.

2. The method of claim 1 wherein the second layer of material is doped with a blanket implant.

3. The method of claim 1 and further comprising the step of forming a sinker of the second conductivity type through the third, fourth, and top layers of material to contact the second layer of material.

4. The method of claim 1 and further comprising the step of forming an isolation trench in the fourth and top layers of material to isolate the second region of the second conductivity type from the sinker.

5. The method of claim 1 wherein the fourth and top layers of material are different.

6. The method of claim 1 wherein the second layer of material has a band gap that is less than a band gap of silicon.

* * * * *